United States Patent [19]
Dam et al.

[11] Patent Number: 5,191,687
[45] Date of Patent: Mar. 9, 1993

[54] PROCESS FOR MAKING PIEZOELECTRIC STACKS

[75] Inventors: Chuong Q. Dam, Peoria; Virgil R. Hester, Delevan; Kurtis C. Kelley, Washington; Carey A. Towe, Peoria, all of Ill.

[73] Assignee: Caterpillar Inc., Peoria, Ill.

[21] Appl. No.: 589,853

[22] Filed: Sep. 28, 1990

[51] Int. Cl.⁵ ........................................... H04R 17/00
[52] U.S. Cl. ................... 29/25.35; 51/73 R; 252/62.9
[58] Field of Search .............. 29/25.35; 51/830, 73 R; 252/62.9

[56] References Cited

U.S. PATENT DOCUMENTS

| | | | |
|---|---|---|---|
| 3,025,738 | 3/1962 | Winkler et al. | 51/73 R X |
| 3,039,235 | 6/1962 | Heinrich | 51/73 |
| 3,187,242 | 6/1965 | Schick | 29/830 X |
| 3,501,099 | 3/1970 | Benson . | |
| 3,589,345 | 6/1971 | Benson . | |
| 3,662,733 | 5/1972 | Okamoto | 51/73 R X |
| 4,011,474 | 3/1977 | O'Neill . | |
| 4,078,284 | 3/1978 | Capek et al. | 29/25.35 |
| 4,228,482 | 10/1980 | Bouchard et al. | 252/62.9 R X |
| 4,514,247 | 4/1985 | Zola | 29/25.35 X |
| 4,970,182 | 11/1990 | Shirasaki | 252/62.9 X |

FOREIGN PATENT DOCUMENTS

| | | |
|---|---|---|
| 0012583 | 7/1979 | European Pat. Off. . |
| 3123916 | 4/1983 | European Pat. Off. . |
| 48-38983 | 6/1973 | Japan ............................ 252/62.9 R |
| 55-163886 | 12/1980 | Japan .................... 29/25.35 |
| 57-23287 | 2/1982 | Japan . |
| 1-208880 | 8/1989 | Japan ................... 29/25.35 |

OTHER PUBLICATIONS

*Piezoelectric Materials* (Physics International Company, Date Unknown).

*Primary Examiner*—Carl J. Arbes
*Attorney, Agent, or Firm*—Sterne, Kessler, Goldstein & Fox

[57] ABSTRACT

A method for making piezoelectric solid state motor stack disks. The method includes the steps of preparing a piezoelectric ceramic powder; preparing a substantially cylindrical piezoelectric ceramic slug from the powder; and cutting the slug with an ID saw into disks of a predetermined thickness. The method further includes pressing the powder in a press at a pressure of between about 1500 psi and 6000 psi and firing the slug at a temperature of between about 1250° C. and 1350° C. for a period of between about 15 min. and 4 hours. The method also comprises the steps of cleaning the ceramic disks after slicing; and applying a conductive layer to a portion of facets of the disks prior to the assembly step.

9 Claims, 6 Drawing Sheets

PROCESS FOR MAKING PIEZOELECTRIC STACKS

BACKGROUND OF THE INVENTION

1. Field of the Invention

The invention relates generally to a process for manufacturing solid state motor actuators. More particularly, the invention relates to a method for making piezoelectric ceramic disks for use in manufacturing piezoelectric motor stacks.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage, and resulting high peak current power to alternately biased electrodes causes each of the piezoelectric disks to expand or axially distort. The additive deflection of the stacked disks is typically amplified by hydraulics to effectuate useful actuation.

An example of a conventional electromechanical actuator having an active element of electroexpansive material is found in U.S. Pat. No. 3,501,099 to Glendon M. Benson. Benson's 1970 patent is directed to both an actuation amplification structure and a method for manufacturing piezoelectric stacks. Sheets of ceramic material are rolled, compacted and punched into ceramic disks. After a cleaning process, the disks are stacked with alternate sets of continuous disk electrodes disposed between the ceramic disks. The stacks undergo a pressurized cold-welding process, followed by an elevated temperature and pressure bonding process after common electrodes are connected to the two electrode groups. The stacks are poled by application of a DC voltage and then encapsulated with a plastic insulating cover prior to final mounting within a transducer housing.

Another conventional method uses epoxy to bond lead zirconium titanate (PZT) ceramic discs together, interleaved with metal foil electrodes. The epoxy used in this process has a lower modulus of elasticity than the ceramic and acts as a compliant layer in the bonded stack structure, thus reducing the additive displacement during actuation.

A modified technique for preparing piezoelectric disks includes a two-stage press/lap manufacturing process. After punching or individually compressing the disks, the thickness of each disk is reduced by lapping. Piezoelectric disk thicknesses are limited to approximately 0.254 mm by this process and require high voltage to generate lattice distortion. Higher driving voltages necessitate larger, more expensive power generation circuits. In turn, the delivery of the higher voltage to the stack imposes wiring harness and connector design difficulties. Moreover, the larger power circuits generate additional heat which must be removed from the engine. These tradeoffs plague stack design and drive up the cost of systems using stacks to actuate value or injection control, for example.

Moreover, the ability to mass produce stacks is limited by the time and cost of manufacturing the disks themselves. Conventional punching or compressing combined with lapping/polishing results in low disk yield due to the time elements of the two step process and disk breakage during the lapping step.

Various environmental design considerations are important in piezoelectric stack manufacturing. Device operating temperature ranges and external mechanical stresses are the most serious of these factors.

Conventional stacks are limited to a maximum operating temperature of about 75° Celsius, measured at the outside of the stack housing. Heat generated by the stack itself is compounded by the extreme heat generated by the engine upon which the housed stack is typically mounted. Stack temperatures can reach upward of 40°-50° above the measured engine temperature.

On the other hand, structural defects typically lead to conventional stack failure due to shear and torsional stresses applied to the stack during operation and/or installation. Structural stack failure is most commonly attributed to fatigue cracking of the ceramic disks. Separation between disks/electrodes is also a frequent problem.

Piezoelectric stack insulation has been introduced between the disk/electrode stack and the housing in an attempt to minimize some of the above mentioned problems.

U.S. Pat. No. 4,011,474 to Cormac G. O'Neill discloses several methods for improving stack insulation to avoid operation breakdowns. Arc-over is allegedly avoided by maintaining contact between the piezoelectric stack and the insulating material. In a first embodiment, O'Neill teaches introducing a pressurized insulating fluid such as oil, into the housing of a piezoelectric stack. The fluid is pressurized so as to maintain contact between the fluid and the stack during radial shrinkage, or axial expansion, upon the application of an applied voltage.

In a second embodiment, O'Neill applies a solid polyurethane coating to the stack. The coating is kept in contact with the stack by a pressurized insulating fluid to prevent separation during operation and arc-over associated therewith.

A third O'Neill embodiment maintains contact between the stack and a solid insulating coating by winding a filament or tape around the coated stack. The tape is wound around the coating to preload the coating to prevent separation of the coating from the stack. The winding of the tape is spaced to allow for expansion of the polyurethane coating during operation of the stack.

The present invention overcomes the deficiencies of the conventional technology noted above.

SUMMARY OF THE INVENTION

The present invention is directed to a method for making piezoelectric solid state motor stack disks. The method includes the steps of preparing a piezoelectric ceramic powder; preparing a substantially cylindrical piezoelectric ceramic slug from the powder; and cutting the slug with an ID saw into disks of a predetermined thickness.

The method further includes pressing the powder in a press at a pressure of between about 1500 psi and 6000 psi and firing the slug at a temperature of between about 1250° C. and 1350° C. for a period of between about 15 min. and 4 hours.

The method also comprises the steps of cleaning the ceramic disks after slicing; and applying a conductive layer to facets of the disks prior to assembly of the stack.

FEATURES AND ADVANTAGES OF THE INVENTION

The present invention eliminates the conventional lapping step to reduce cost. The method of the present invention permits high ceramic disk yield which greatly reduces stack manufacturing time. In addition, the percentage of flawed disks resulting from the present invention is small compared to the percentage of flawed disks resulting from the conventional technology processes.

Moreover, the present invention can minimize disk thickness, optimize facet surface uniformity and smoothness, assure uniform disk diameter and maintain facet parallelism, all in one step. These and other benefits, such as increased stack operational temperature range, endurance, output, and lifetime, are achieved by the present invention.

BRIEF DESCRIPTION OF THE DRAWINGS

The invention will be better understood if reference is made to the accompanying drawings in which.

DETAILED DESCRIPTION OF THE PREFERRED EMBODIMENT

Broadly, the present method for making piezoelectric stacks is designed for an automated manufacturing process to yield high-quality, high-durability solid state motor stacks in great volume. The piezoelectric disk fabrication process of the present invention for making piezoelectric stacks has refined the technology by employing careful pressing, cutting, cleaning and inspection operations which result in a faster and more cost-effective manufacturing process for making stacks that can displace 0.13% in fast response times of 100 microseconds, and produce driving forces greater than 35 MPa.

Piezoelectric solid state motor stacks made by the process of the present invention are high-force devices that can be used to improve engine performance, reduce emissions, and reduce engine noise. The utility of these stacks is not, however, limited to engine valve and fuel injector actuation. The stacks may be used in brake or shock absorbing systems, for example. Moreover, the stacks may be used in a wide variety of devices or systems requiring fluid or mechanical actuation, as well as shock or sound wave production.

These exemplary operational advantages coupled with the present method's ability to produce in excess of 20,000 ceramic disks per hour or approximately 300 completed stacks per hour, results in low cost per unit, permitting a wide range of new uses for piezoelectric stacks.

Figure 1:
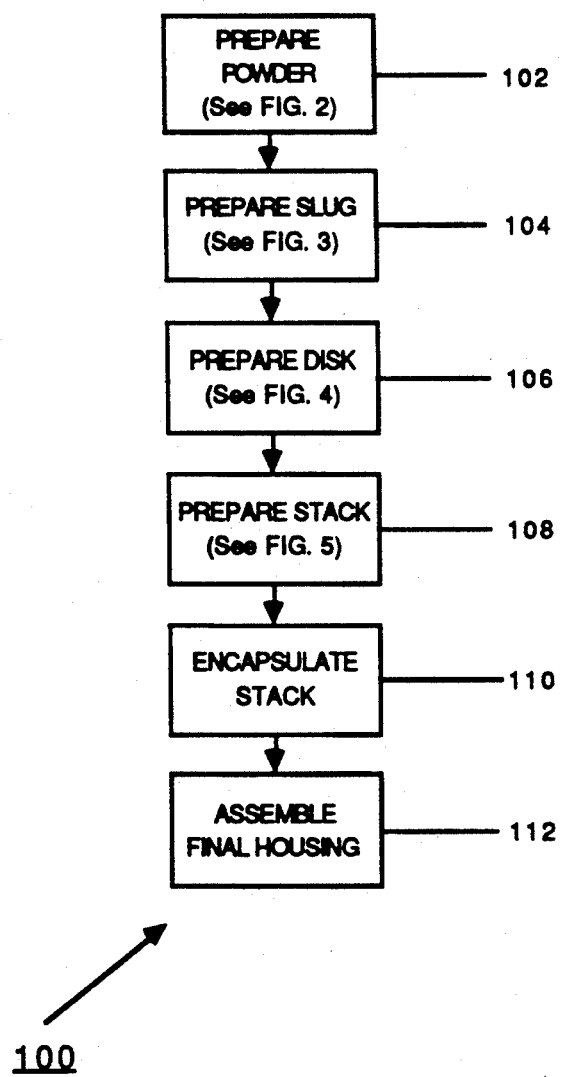
FIG. 1 is a block diagram of the generalized method of the invention.

Referring now to FIG. 1, a block diagram is shown of the representative steps in a generalized method of the present invention. It should be understood that the present invention is directed to a method of manufacturing, piezoelectric solid state motor stacks. However, the terms solid state motor stack and electroexpansive actuator, for example, are synonymous. Throughout this discussion, the piezoelectric solid state motor stacks will be commonly referred to as "stacks."

As shown in FIG. 1, the first step in the process, as shown generally at block 100, is to prepare the ceramic powder. This step is indicated by the block 102. Cylindrical slugs are then prepared from the ceramic powder mixture as shown in block 104. The block shown at 106 represents the preparation of disks from the ceramic slug.

Preparation of the stack as shown at block 108 includes the assembly of a plurality of ceramic disks stacked in an interleaved fashion with a plurality of electrodes. The stacking of the disks and assembly of the disk stack to form a motor is described in detail in copending, commonly owned application Ser. No. 07/787,786 filed Oct. 24, 1991, titled "Piezoelectric Motor Stack," the entire disclosure of which is incorporated herein by reference. Once the stack is completed, it is encapsulated as shown at block 110. A preferred encapsulation technique is described in detail in copending, commonly owned application Ser. No. 07/589,850, filed Sep. 28, 1990, now U.S. Pat. No. 5,148,077, issued Sep. 15, 1992, titled "Coating Surrounding a Piezoelectric Solid State Motor Stack," the entire disclosure of which is incorporated herein by reference. Finally, each stack is assembled in a protective housing as shown at block 112.

Figure 2:
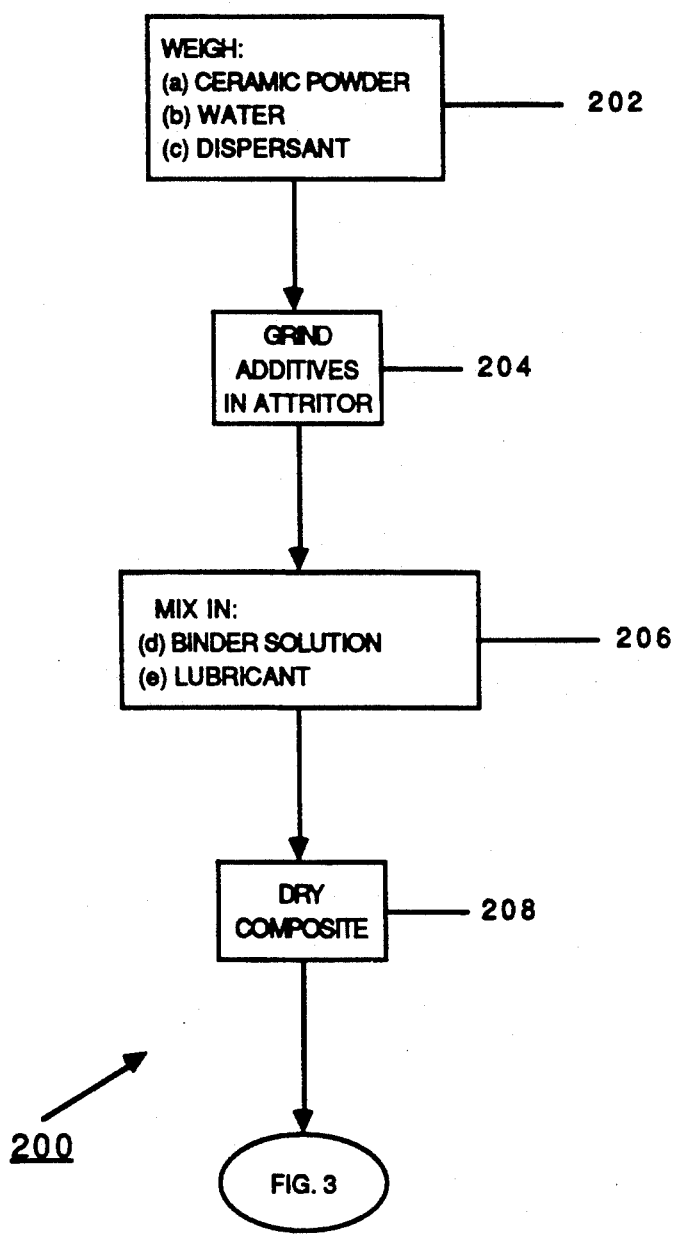
FIG. 2 is a flow chart of the basic steps in a method for preparing powder in connection with the present invention.

FIG. 2 is a block diagram representation of the powder preparation step shown in block 102 of FIG. 1. To achieve optimum electromechanical piezoelectric properties, the ceramic powder, such as Ultrasonic Powers, Inc., UP-501A ceramic powder, for example, must be mixed with water and a dispersant, such as Colemaster's A-23 dispersant, as shown at block 202. This commercially available lead-zirconium titanate ceramic powder is preferred.

As shown at block 204, the additives are ground in an attritor to achieve uniform particle size prior to the addition of a binder and lubricant. As shown at block 206, a binder solution and lubricant are thoroughly mixed in with the ground additives. The preferred binder is an 18% solution of Dow Corning XUS40303.00. Dow Corning polyglycol E-400 lubricant is preferred. The mixture, which preferably contains about 1.2%–2.4% of binder and 0.25%–1.75% lubricant, is then transferred to a generic stirring or holding tank. The mixture is run through a spray dryer and forwarded to a holding tank. The spray dryer agglomerates the powder into spheres which will flow easily through an automatic feed system to a compaction press. Drying of the composite is shown generally at block 208 of FIG. 2.

Figure 3:
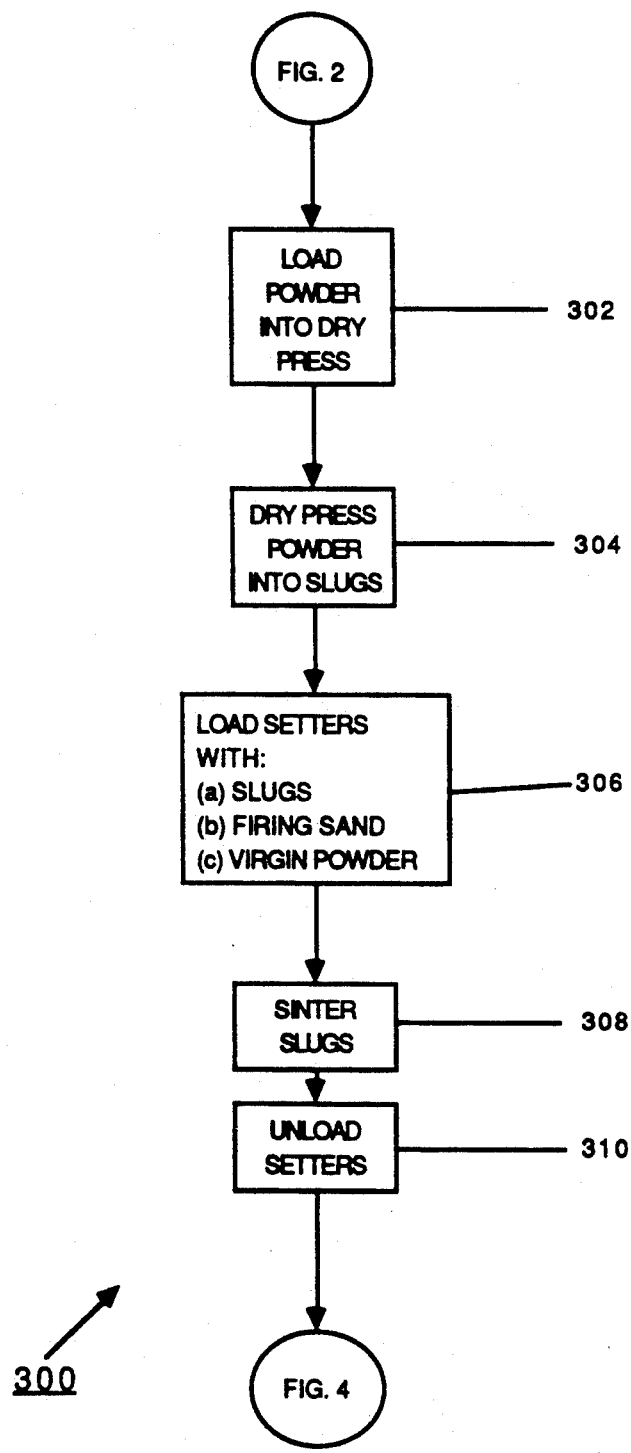
FIG. 3 is a flow chart of the basic steps in a method for slugs in connection with the present invention.

The preparation of ceramic slugs is shown generally at 300 in the block diagram of FIG. 3. The dried prepared ceramic powder is loaded into a hydraulic press. The press compacts the powder into green slugs by applying a pressure of approximately 1500 psi–6000 psi (preferably around 41 MPa) during a time interval of about 3–30 seconds, and preferably closer to 30 seconds.

Iso-pressing of the slugs may also be employed. The loading and pressing of the slugs is shown generally at blocks 302 and 304 of FIG. 3, respectively. The pressed ceramic slugs must be maintained in a dry atmosphere prior to the curing process in order to eliminate absorption of moisture.

Pressing the ceramic powder mixture to prepare the green slugs goes contrary to the conventional wisdom. According to the present invention, the diameter of the slug can be held by pressing alone. Using the techniques of the present invention, the pressing length is greater that the pressing diameter. Conventionally, in making ceramic slugs, the pressing length is held to no more than one-half the slug diameter.

As shown at box 306, the slugs are loaded into setters, or covered ceramic crucibles, along with firing sand and virgin powder. Depending on the ceramic powder used, an oxygenator may be added to the firing sand and slugs to provide an oxygen-rich atmosphere during the sintering process shown at block 308. The slugs are then inspected to identify cracks and voids in the ceramic lattice.

The slugs are sintered in a known manner. The temperature is linearly increased over time from room temperature to the soaking temperature, which is in the range of 1250° C. and 1350° C. The preferably usable soaking temperature range is about 1280° C. and 1320° C., and is more preferably about 1300° C. The slugs are kept at the soaking temperature for between about 15 minutes and 4 hours, and preferably about half an hour. This soaking is followed by a ten (10) hour cooling-off period. The firing sand is used to suspend the slugs during sintering and to furnish lead to the surrounding atmosphere. The lead atmosphere is necessary to maintain proper levels of lead in the ceramic slugs. Evaporation of lead from the ceramic could adversely affect the electromechanical properties of the slugs. The setters are then unloaded as shown at block 310. The final dimensions of the slug are only limited in practice by the required diameter for the ceramic disks.

Figure 4:
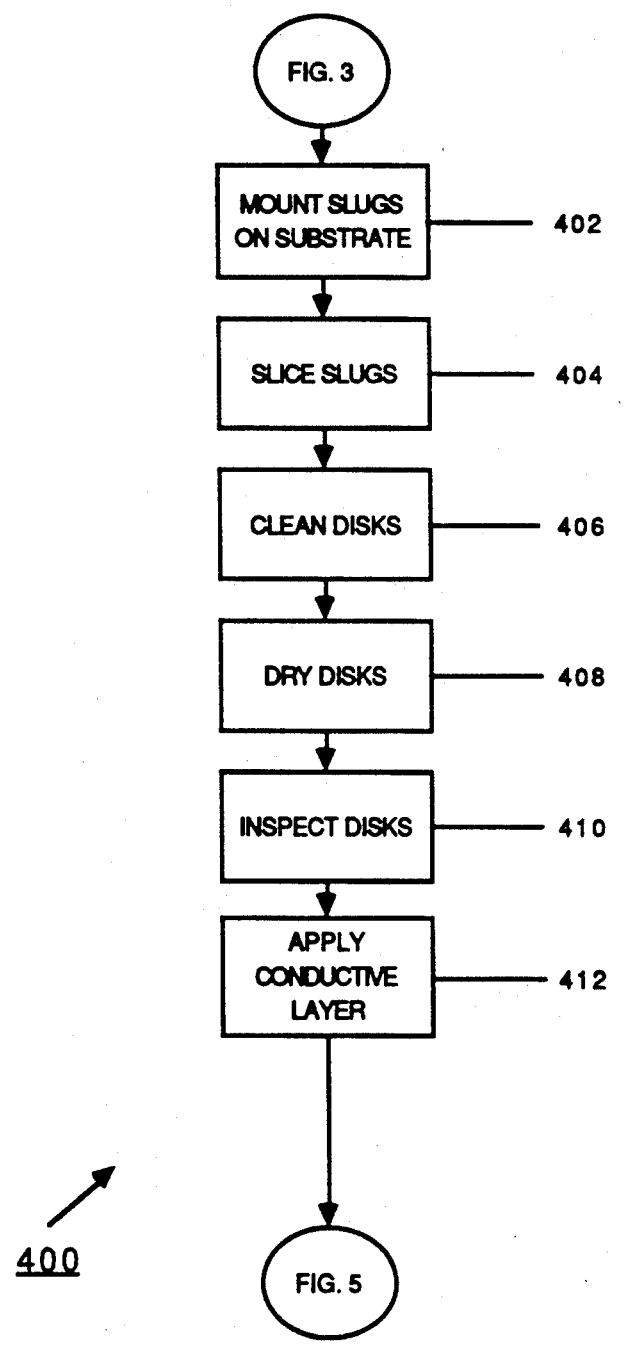
FIG. 4 is a flow chart of the basic steps in a method for preparing ceramic disks in connection with the present invention.

Preparation of the ceramic disks is shown generally at 400 of FIG. 4. A plurality of slugs are first mounted on a graphite substrate using a no-load mounting wax. The mounting step is shown at block 402. The preferred no-load mounting cement is TanWax, supplied by Specialized Grinding Systems, Inc.

Disks are then sliced or cut from the slugs as shown at block 404. Extremely thin ceramic disks requiring lower applied voltage to achieve expansion are sliced using an ID saw. A 320 grit, 0.38 mm thick diamond-studded inner diameter circular saw is preferred. The inner table of the ID saw may also be fitted with a special mount to permit simultaneous sawing of several groups of mounted slugs. The combination of the ID saw and mounting cement wax is used to prevent burring at the disk edges. A speed of 1600 rpm and a table feed rate of 40 mm per minute is preferred.

Ceramic disks of several different thicknesses are required for the piezoelectric solid state motor stacks of the present invention. Batch processing may be used to slice disks of various thicknesses by varying the cutting parameters of the ID saw. A filter system may be employed to remove ceramic slicing material or kerf loss from the cutting fluid.

The wax is removed using a methanol bath. The disk cleaning, as shown at block 406 of FIG. 4, is completed with an ultrasonic cleaning using an acetone bath followed by another ultrasonic cleaning using a methanol rinse.

As shown at block 408, the disks are then dried in an oven.

The disks are inspected, as shown at 410, for microscopic cracks and other imperfections. Disk thickness and diameter are also checked. A surface space profiler is used to measure facet surface finish, parallelism and flatness.

The last step in the disk preparation process is shown at block 412. Block 412 depicts the application of a conductive layer to each of the facet surfaces of the ceramic disks. Each facet surface of the disks is coated with a 2,000 Å coating of aluminum. The application of the conductive layer may be accomplished by various conventional methods. The conductive layer is preferably applied to all of the surface area of the upper and lower facets of the disks. Uniformity of the conductive layer is desired. However, uniformity and full facet surface coverage may be limited by the method used to apply the conductive layer.

The conductive layer may be applied by spraying or mechanically rubbing atomic layers of the conductive material onto the facet surfaces of the disks. Chemical vapor deposition may also be used to apply the conductive layer. The conductive layer may also comprise copper, nickel or silver. The conductive layer functions to more evenly spread the electric field across the surface of the disk when a voltage is applied to an adjacent electrode in the final stack structure. The conductive layered disks are appropriately positioned in protective containers to avoid contamination prior to the stacking process.

Figure 5:
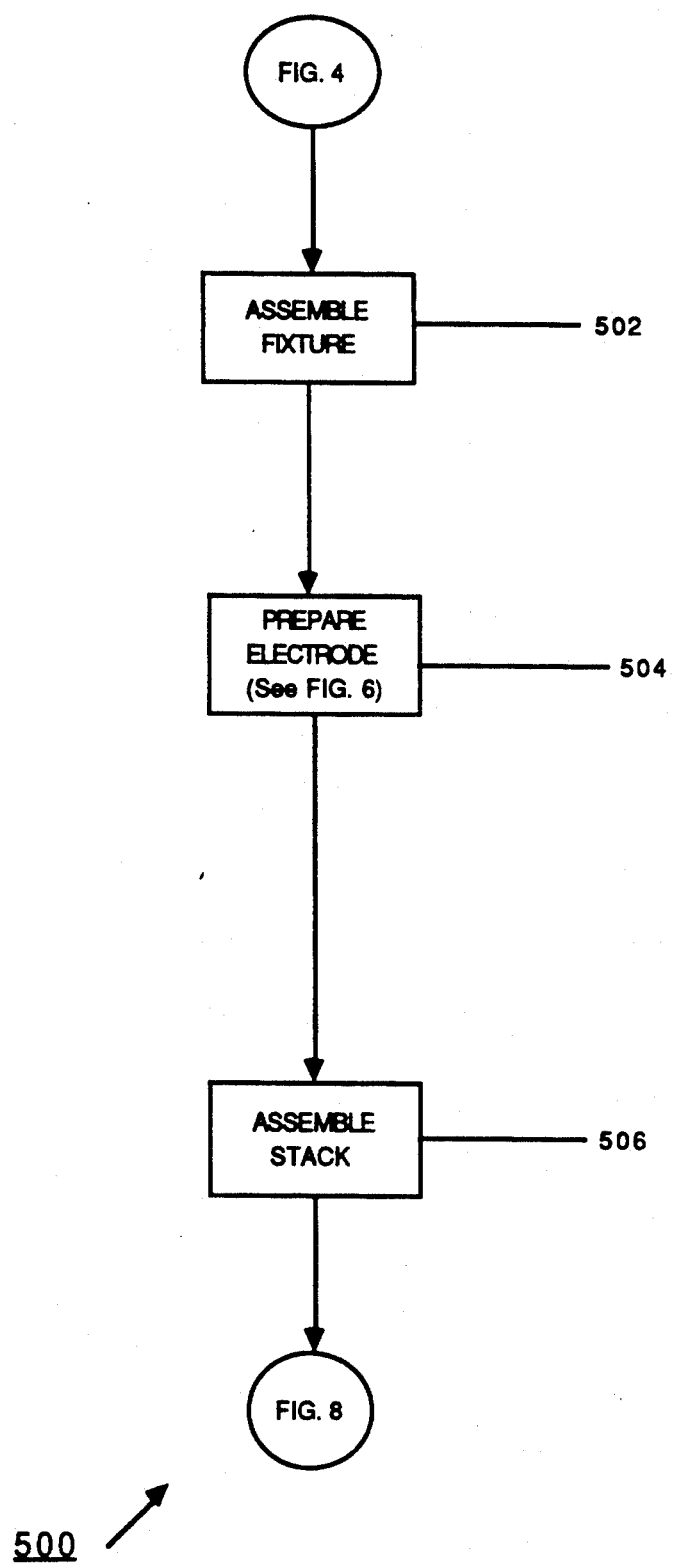
FIG. 5 is a flow chart of the basic steps in a method for a piezoelectric stack in connection with the present invention.

Referring now to FIG. 5 of the drawings, block 500 pertains to the general stacking of the disks and electrodes. As shown at block 502, a temporary assembly fixture is used for proper alignment of the disks and interleaved electrodes. Preparation of electrodes is shown generally as 504 and is explained in further detail with reference to FIG. 6.

Several electrode structures are conventionally used for piezoelectric solid state stacks. A first electrode scheme uses individual foil electrodes. Each of the individual foil electrodes includes a tab located at a designated position on the circumference of the electrode. The electrodes are typically stamped from copper, brass or beryllium-copper foil. The foil electrodes may also include a matrix of small holes. These holes facilitate radial expansion and contraction of the electrode during actuation of the stack. Electrodes with holes require photo-etch processing rather than the stamping process.

A continuous electrode structure may also be used. In the continuous structure, every other electrode of the stack is connected via a strap. In a stack structure comprising two separate sets of electrode groups ultimately biased to a power supply, the first group of electrodes can be interconnected via the continuous electrode structure, and the second group of electrodes may also be interconnected via the continuous electrode structure.

Examples of electrodes usable with piezoelectric motor stacks of the type manufactured in accordance with the method of this invention are described in detail in co-pending, commonly owned application Ser. No. 07/590,110, filed Sep. 28, 1990, now U.S. Pat. No. 5,055,734, issued Oct. 8, 1991, titled "Single Piece Multiple Electrode Conductor."

Figure 6:
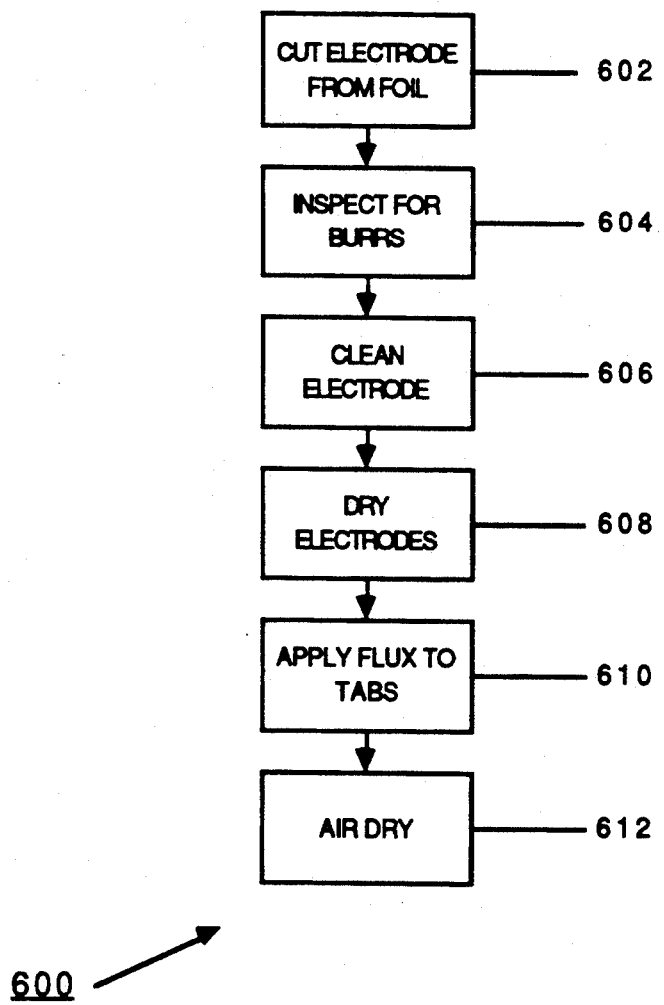
FIG. 6 is a flow chart of the basic steps in a method for preparing electrodes in connection with the present invention.

For purposes of illustration only, FIG. 6 is directed to the preparation of individual electrodes. As shown at block 602 of the process 600, the electrodes must first be cut from a foil sheet. It is also possible to purchase pre-cut electrodes commercially.

The cut electrodes must be inspected for burrs as shown in block 604. Once burrs have been removed, the electrodes are cleaned in an ultrasonic cleaner with a warm methanol bath. This cleaning step is shown in box 606. This cleaning removes residue from the electrodes. The electrodes are oven dried at step 608 to remove the remaining methanol.

Liquid solder flux is then applied to the tabs of the electrodes as shown at block 610. An acid-based flux, such as Qualitex No. 65, should be used, which has no contaminants such as chlorides. Also, a resin-based flux, suitable for foaming, will work as well. It should be easy to rinse off excess flux.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

We claim:

1. A method for making piezoelectric solid state motor stack disks without post cutting lapping of the disks, comprising the steps of:
   preparing a piezoelectric ceramic powder;
   preparing a substantially cylindrical piezoelectric ceramic slug having an axial length greater than its diameter from said powder, by:
   (1) pressing said ceramic powder to form said ceramic slug; and
   (2) thereafter, heating said ceramic slug substantially above room temperature to cure it; and
   cutting said slug substantially at right angles to its axial length into finished disks of predetermined thickness using an ID saw, without subsequent post-cutting lapping of the disks, wherein said disks of predetermined thickness are superior for use in the piezoelectric solid state motor stack than conventional lapped disks.

2. A method for making piezoelectric solid state motor stack disks according to claim 1, wherein said pressing step is performed at a pressure of between about 1500 psi and 6000 psi.

3. A method for making piezoelectric solid state motor stack disks according to claim 1, wherein said heating step is performed at a temperature of between about 1250° C. and 1350° C.

4. A method for making piezoelectric solid state motor stack disks according to claim 3, wherein said heating step is performed for a period of between about 15 min. and 4 hours.

5. A method according to claim 1, wherein said slicing step further comprises the step of mounting a plurality of said slugs on a substrate for simultaneous slicing by said ID saw.

6. A method according to claim 1, further comprising the steps of:
   cleaning said ceramic disks after said cutting; and
   applying a conductive layer to a portion of facets of said disks.

7. A method according to claim 6, wherein said conductive layer is applied by sputtering.

8. A method according to claim 6, wherein said conductive layer is applied by mechanically coating said portion of said facets.

9. A method according to claim 6, wherein said conductive layer is applied by spraying a conductive material on said portion of said facets.

* * * * *